US012431847B2

(12) United States Patent
Masumoto (10) Patent No.: US 12,431,847 B2
(45) Date of Patent: Sep. 30, 2025

(54) POWER AMPLIFIER CIRCUIT (71) Applicant: Murata Manufacturing Co., Ltd., Kyoto (JP)

(72) Inventor: Shiro Masumoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 619 days.

(21) Appl. No.: 17/812,217

(22) Filed: Jul. 13, 2022

(65) Prior Publication Data

US 2023/0014984 A1 Jan. 19, 2023

(30) Foreign Application Priority Data

Jul. 16, 2021 (JP) .................. 2021-117631

(51) Int. Cl.
*H03F 3/20* (2006.01)
*H03F 1/56* (2006.01)
*H03F 3/60* (2006.01)

(52) U.S. Cl.
CPC ................. *H03F 3/20* (2013.01); *H03F 1/56* (2013.01); *H03F 3/60* (2013.01); *H03F 2200/387* (2013.01)

(58) Field of Classification Search
CPC ..... H03F 3/20; H03F 1/56; H03F 3/60; H03F 2200/387; H03F 3/245; H03F 3/601; H03F 3/195; H03F 3/213
USPC ........................................ 330/302–305, 277
See application file for complete search history.

(56) References Cited

U.S. PATENT DOCUMENTS

| 8,350,627 B2 * | 1/2013 | Hellberg ............... H03F 1/0205 330/302 |
| 9,602,063 B2 * | 3/2017 | Kaatz ..................... H03F 3/193 |
| 2017/0149391 A1 | 5/2017 | Kaatz et al. |

FOREIGN PATENT DOCUMENTS

JP 2013-009031 A 1/2013

* cited by examiner

*Primary Examiner* — Hieu P Nguyen
(74) *Attorney, Agent, or Firm* — McDonald Hopkins LLC (57) ABSTRACT A power amplifier circuit includes an amplifier that amplifies an input signal RFin, a matching circuit that provides impedance matching between an output port of the amplifier and an output terminal, an input of the matching circuit being connected to the output port of the amplifier, an output of the matching circuit being connected to the output terminal, and a resonant circuit provided between ground and a signal path that connects the output port of the amplifier and the input of the matching circuit, the resonant circuit resonating at a resonant frequency greater than or equal to the frequency of a fourth harmonic wave of an amplified signal obtained by amplifying the input signal.

8 Claims, 10 Drawing Sheets

POWER AMPLIFIER CIRCUIT

CROSS REFERENCE TO RELATED APPLICATION

This application claims priority from Japanese Patent Application No. 2021-117631 filed on Jul. 16, 2021. The content of this application is incorporated herein by reference in its entirety.

BACKGROUND ART

The present disclosure relates to a power amplifier circuit.

In mobile communications, such as cellular phones, power amplifier circuits are used for amplifying the power of transmission signals. It is desirable that the power amplifier circuit amplifies a transmission signal with a high degree of efficiency in accordance with the frequency of the transmission signal. For the purpose of highly efficient amplification of a transmission signal, a control is performed such that the phase of reflection coefficient of a harmonic wave of the transmission signal is adjusted so as to make an amplifier included in the power amplifier circuit operate with an even higher degree of efficiency. Japanese Unexamined Patent Application Publication No. 2013-9031 (patent document 1) describes a power amplifier circuit in which a variable line tuner for third harmonic wave is connected to a harmonic wave reflection filter and the phase of reflection coefficient of a harmonic wave is adjusted in accordance with the frequency of a transmission signal.

BRIEF SUMMARY

The amplifier in the power amplifier circuit can be operated with a high degree of efficiency by adjusting the impedance looking from the amplifier of the power amplifier circuit to the output side and adjusting the phase of reflection coefficient of a harmonic wave. However, in the harmonic wave filter and the variable line tuner for third harmonic wave described in the patent document 1, it is difficult to appropriately adjust the phase of reflection coefficient of a harmonic wave (particularly, the third harmonic wave).

The present disclosure provides a power amplifier circuit that enables the phase of reflection coefficient of the third harmonic wave to be appropriately adjusted.

A power amplifier circuit according to one aspect of the present disclosure includes: an amplifier that outputs an amplified signal obtained by amplifying an input signal; a matching circuit that provides impedance matching between an output port of the amplifier and an output terminal, an input of the matching circuit being connected to the output port of the amplifier, an output of the matching circuit being connected to the output terminal; and a resonant circuit provided between ground and a signal path that connects the output port of the amplifier and the input of the matching circuit, the resonant circuit resonating at a resonant frequency that is greater than or equal to a frequency of a fourth harmonic wave of the amplified signal.

According to the present disclosure, it is possible to provide a power amplifier circuit that enables the phase of reflection coefficient of the third harmonic wave to be appropriately adjusted.

DETAILED DESCRIPTION

Figure 1:
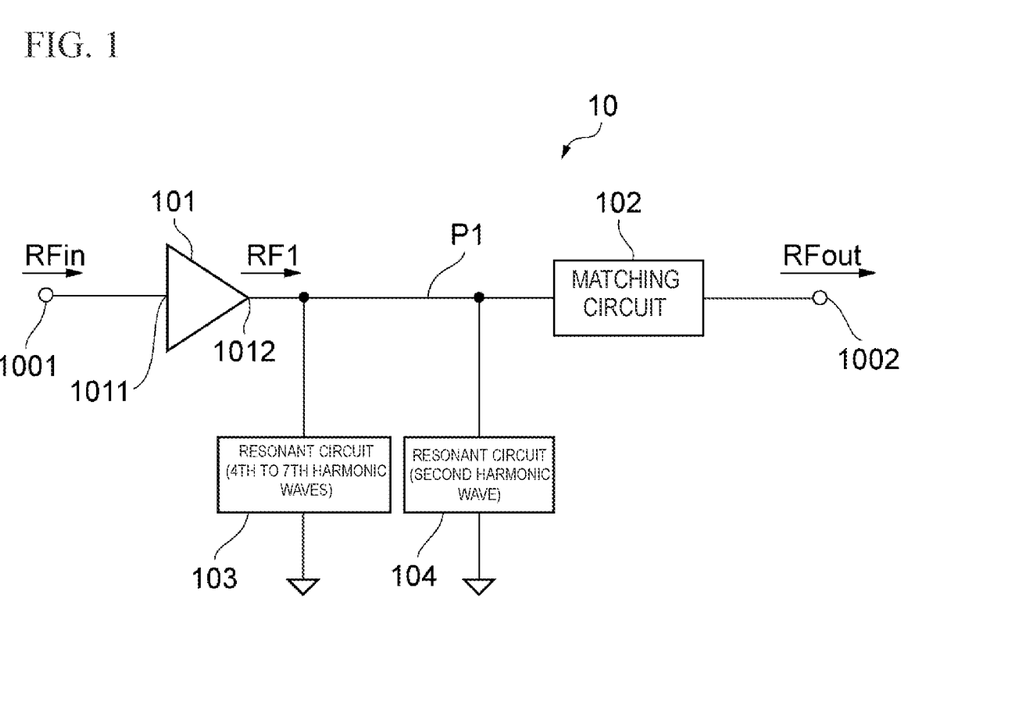
FIG. 1 is a block diagram of a power amplifier circuit according to a present embodiment.

A present embodiment is now described. FIG. 1 illustrates a block diagram of a power amplifier circuit 10 according to a first embodiment. The power amplifier circuit 10 includes an amplifier 101, a matching circuit 102, and resonant circuits 103 and 104.

The power amplifier circuit 10 amplifies power by amplifying an input signal RFin input from an input terminal 1001 by using the amplifier 101 and outputting an output signal RFout from an output terminal 1002.

The amplifier 101 includes an input port 1011 and an output port 1012. The input port 1011 is connected to the input terminal 1001. The output port 1012 is connected to the matching circuit 102 and the resonant circuits 103, and 104 via a signal path P1.

The amplifier 101 amplifies power by using, for example, a bipolar transistor, such as a heterojunction bipolar transistor (HBT), or a field-effect transistor, such as a metal-oxide-semiconductor field-effect transistor (MOSFET).

The amplifier 101 outputs an amplified signal RF1, which is obtained by amplifying the input signal RFin, from the output port 1012.

The matching circuit 102 is connected to the output port 1012 at input and connected to the output terminal 1002 at output. The matching circuit 102 is a circuit that provides impedance matching between the output port 1012 and the output terminal 1002. The matching circuit 102 converts impedance such that a low impedance on the output port 1012 side matches a high impedance on the output terminal 1002 side.

The resonant circuit 103 is provided between the signal path P1 and ground. The resonant circuit 103 suppresses a harmonic wave of the amplified signal RF1 from propagating to the output terminal 1002 by adjusting the impedance looking from the output port 1012 to the output terminal 1002 side. Hereinafter, suppressing a harmonic wave from propagating to the output terminal 1002 by adjusting the impedance is also referred to as to terminating a harmonic wave. The resonant circuit 103 terminates harmonic waves within the frequency range from four times to seven times the frequency of the fundamental wave (fundamental frequency) of the amplified signal RF1. Specifically, the resonant circuit 103 resonates at frequencies in the frequency range from four times to seven times the frequency of the fundamental wave (fundamental frequency) of the amplified signal RF1 and thus provides electrical continuity to the ground for the harmonic waves of these frequencies. Hereinafter, the harmonic wave whose frequency is N times the frequency of the fundamental wave is referred to as Nth harmonic wave.

The resonant circuit 104 is provided between the signal path P1 and the ground. The resonant circuit 104 is provided as a subsequent stage of the resonant circuit 103. The resonant circuit 104 terminates the second harmonic wave of the amplified signal RF1.

The power amplifier circuit 10 adjusts the phase of reflection coefficient of the third harmonic wave when looking from the output port 1012 to the output terminal 1002 by using the resonant circuit 103, which is provided in the signal path P1 whose impedance is low. Further, the power amplifier circuit 10 adjusts, by using the resonant circuit 104, the phase of reflection coefficient of the second harmonic wave when looking from the output port 1012 to the output terminal 1002. This enables the power amplifier circuit 10 to adjust an impedance condition that enables the amplifier 101 to operate with an even higher degree of efficiency.

Figure 2:
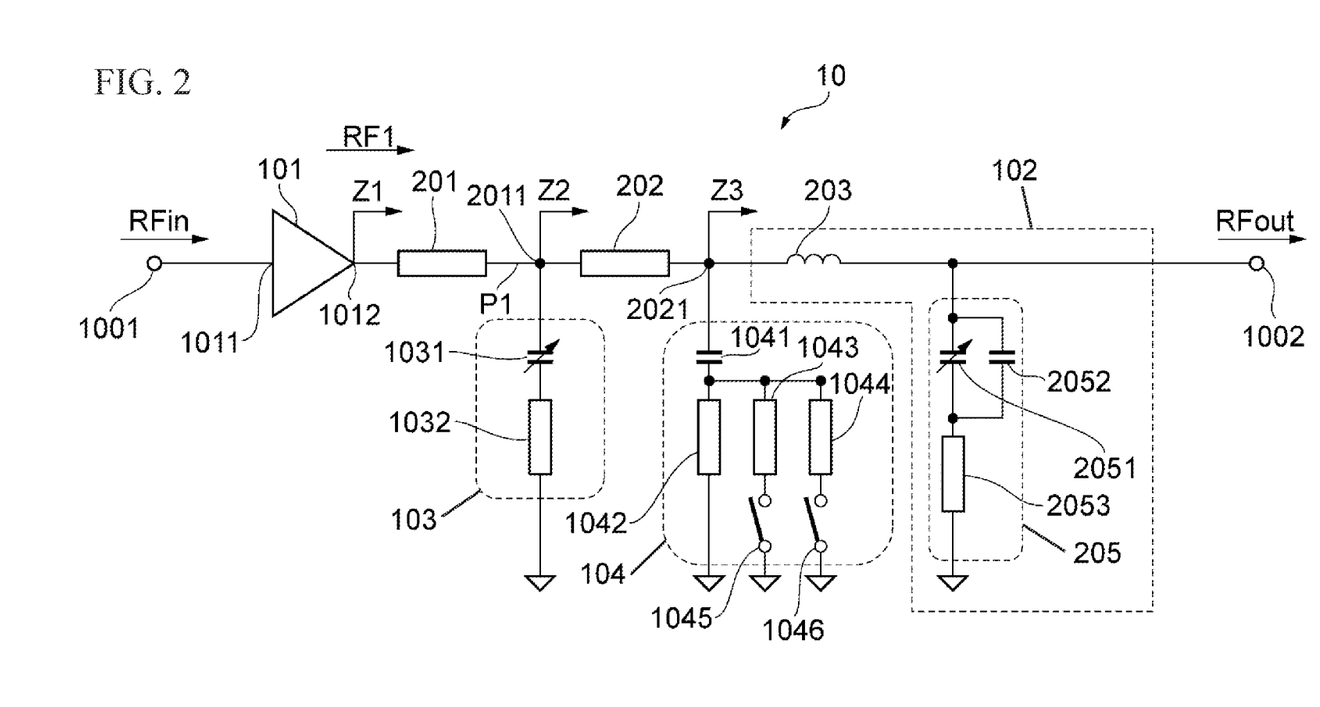
FIG. 2 is a circuit diagram of the power amplifier circuit according to the present embodiment.

Referring to FIG. 2, the power amplifier circuit 10 is described in detail. FIG. 2 illustrates a circuit diagram of the power amplifier circuit 10.

In the following description, the impedance looking from the output port 1012 to the output terminal 1002 is referred to as impedance Z1, the impedance looking from a node 2011 to the output terminal 1002 is referred to as impedance Z2, and the impedance looking from a node 2021 to the output terminal 1002 is referred to as impedance Z3. For example, the impedance for the second harmonic wave looking from the output port 1012 to the output terminal 1002 is described as the impedance Z1 of the second harmonic wave.

The resonant circuit 103 (first resonant circuit) includes a variable capacitance element 1031 and an inductor 1032. The variable capacitance element 1031 is connected to the node 2011 of the signal path P1 at one end and is connected to one end of the inductor 1032 at the other end. The other end of the inductor 1032 is connected to ground.

The variable capacitance element 1031 is a digitally tunable capacitor (DTC) in which the capacitance value is controlled. In the DTC, the capacitance value is switched in response to a control signal to be supplied. In the present embodiment, the capacitance value of the variable capacitance element 1031 is controlled in accordance with the frequency of the input signal RFin. For example, when the frequency of the input signal RFin is relatively low, the capacitance value of the variable capacitance element 1031 is controlled to be at a relatively large value, and when the frequency of the input signal RFin is relatively high, the capacitance value of the variable capacitance element 1031 is controlled to be at a relatively small value. Note that as the variable capacitance element 1031, a varicap diode may also be used.

The resonant circuit 103 is a LC series resonant circuit that is controlled so as to resonate at resonant frequencies in the frequency range of the fourth harmonic wave to the seventh harmonic wave. By allowing the resonant circuit 103 to resonate at predetermined resonant frequencies, harmonic waves having frequencies close to the resonant frequencies are short-circuited. That is to say, for signals of these resonant frequencies, the impedance Z2 takes a value close to zero. Further, at this time, the impedance Z2 of the third harmonic wave also takes a value that corresponds to the capacitance value of the variable capacitance element 1031. However, the impedance Z2 of the third harmonic wave does not take a value close to zero.

The impedance Z1 of the third harmonic wave is impedance-converted by the inductance formed by a wiring line of the signal path P1 in between the output port 1012 and the node 2011. Note that this inductance is illustrated in FIG. 2 using a lumped parameter model, assuming this inductance is formed by an inductor 201. The impedance Z1 for the third harmonic wave has a value obtained by impedance-converting the impedance Z2 for the third harmonic wave by using the inductor 201. This enables the phase of reflection coefficient of the third harmonic wave and the impedance Z1 for the third harmonic wave to be adjusted.

The resonant circuit 104 (second resonant circuit) includes a capacitance element 1041, inductors 1042, 1043, and 1044, and switches 1045 and 1046.

The capacitance element 1041 is connected to the node 2021 of the signal path P1 at one end and is connected to one end of each of the inductors 1042, 1043, and 1044 at the other end.

The inductor 1042 is connected to the ground. The inductor 1043 is connected to the ground via the switch 1045. The inductor 1044 is connected to the ground via the switch 1046.

The On/Off states of each of the switches 1045 and 1046 are switched by a control signal that corresponds to the band of the input signal RFin. In accordance with the On/Off states of the switches 1045 and 1046, a composite inductance value based on the inductance values of the inductor 1042, the inductor 1043, and the inductor 1044 is controlled. Accordingly, the inductors 1042, 1043, and 1044 and the switches 1045 and 1046 can be viewed as a single variable inductance element. For example, when the frequency of the input signal RFin is relatively low, the composite inductance value is controlled to be at a relatively large value, and when the frequency of the input signal RFin is relatively high, the composite inductance value is controlled to be at a relatively small value.

The resonant circuit 104 includes the capacitance element 1041 and the inductors 1042, 1043, and 1044, which are connected in series to the capacitance element 1041, and is a LC series resonant circuit that is controlled so as to resonate at the frequency of the second harmonic wave. By allowing the resonant circuit 104 to resonate at the frequency of the second harmonic wave, the second harmonic wave is short-circuited. That is to say, the impedance Z3 for the second harmonic wave takes a value close to zero.

The impedance Z3 for the second harmonic wave is impedance-converted by an inductor 202, which is illustrated using a lumped parameter model as is the case with the inductor 201, and the inductor 201. This impedance conversion enables the phase of reflection coefficient of the second harmonic wave and the impedance Z1 for the second harmonic wave to be adjusted.

The matching circuit 102 includes an inductor 203 and a resonant circuit 205. The inductor 203 is connected to the node 2021 at one end and is connected to the output terminal 1002 at the other end. The resonant circuit 205 is provided so as to connect a point between the other end of the inductor 203 and the output terminal 1002 to the ground.

The resonant circuit 205 includes a variable capacitance element 2051, a capacitance element 2052, and an inductor 2053. The variable capacitance element 2051 is connected to the other end of the inductor 203 at one end and is connected to one end of the inductor 2053 at the other end. The other end of the inductor 2053 is connected to the ground. The capacitance element 2052 is connected in parallel to the variable capacitance element 2051.

The variable capacitance element 2051 is a DTC, as is the case with the variable capacitance element 1031. The capacitance value of the variable capacitance element 2051 is controlled in accordance with the band of the input signal RFin. For example, when the frequency of the input signal RFin is relatively low, the capacitance value of the variable capacitance element 2051 is controlled to be at a relatively large value, and when the frequency of the input signal RFin is relatively high, the capacitance value of the variable capacitance element 2051 is controlled to be at a relatively small value. Note that as the variable capacitance element 2051, a varicap diode may also be used.

The resonant circuit 205 is a LC series resonant circuit that is controlled so as to terminate the second harmonic wave, the third harmonic wave, and the fourth harmonic wave. Note that the capacitance element 2052 is provided to ensure the capacitance value. The second harmonic wave to the fourth harmonic wave are short-circuited by allowing the resonant circuit 205 to resonate at predetermined frequencies of the second harmonic wave to the fourth harmonic wave. The second harmonic wave to the fourth harmonic wave are signals having higher power compared with harmonic waves of still higher orders, and thus the second harmonic wave to the fourth harmonic wave are sufficiently terminated by using both the resonant circuit 104 and the resonant circuit 205.

The matching circuit 102 provides impedance matching by converting a low impedance on the output port 1012 side to a high impedance on the output terminal 1002 side by using the inductor 203 and the resonant circuit 205.

Advantages of the power amplifier circuit 10 are now described using, for example, the case where the amplifier 101 operates in a way close to Class-F operation. At this time, the impedance of the second harmonic wave can move closer to the short circuit side on the Smith chart, and the impedance of the third harmonic wave can move closer to the open circuit side on the Smith chart. At this time, the phase of reflection coefficient of the second harmonic wave becomes closer to 180 degrees, and the phase of reflection coefficient of the third harmonic wave becomes closer to 0 degrees. Note that in the case where the operation of the amplifier 101 is to be made close to Class-F operation, the impedance of the second harmonic wave can move closer to the short circuit side on the Smith chart. However, it is optional to be completely in the short circuit state. Further, the impedance of the third harmonic wave can move closer to the open circuit side on the Smith chart. However, it is optional to be completely in the open circuit state.

In the power amplifier circuit 10, the impedance Z1 for the second harmonic wave and the phase of reflection coefficient of the second harmonic wave are adjusted by the resonant circuit 104, and the impedance Z1 for the third harmonic wave and the phase of reflection coefficient of the third harmonic wave are adjusted by the resonant circuit 103. The resonant circuit 103 is not a circuit that terminates the third harmonic wave, and thus the impedance Z2 for the third harmonic wave does not become zero.

Accordingly, in the power amplifier circuit 10, it is possible to perform impedance conversion of the impedance Z2 for the third harmonic wave, which is at a position somewhat separated from the open circuit side on the Smith chart, by using the inductor 201. The impedance Z1 for the third harmonic wave at the output port 1012 is at a position even closer to the open circuit side on the Smith chart. In other words, the phase of reflection coefficient of the third harmonic wave at the output port 1012 becomes even closer to 0 degrees. This enables the amplifier 101 to be even closer to Class-F operation.

As described above, by changing the phase of reflection coefficient of the third harmonic wave at the output port 1012 depending on the resonant frequency of the resonant circuit 104, the power amplifier circuit 10 enables the phase of reflection coefficient of the third harmonic wave to be adjusted to a phase that corresponds to the operation of the amplifier 101.

Further, the power amplifier circuit 10 having a small configuration enables the phase of reflection coefficient of the third harmonic wave to be adjusted to a phase that corresponds to the operation of the amplifier 101. If the resonant circuit 103 is provided as a subsequent stage of the matching circuit 102, it is suitable to adjust the impedance Z1 by adjusting a high impedance value resulting from the impedance conversion by the matching circuit 102. In this case, values of elements increase. As a result, the sizes of the elements to be provided in the resonant circuit 103 increase. On the other hand, in the power amplifier circuit 10, by providing the resonant circuit 103 as a preceding stage of the matching circuit 102, it is possible to use smaller elements for adjusting the phase of reflection coefficient of the third harmonic wave.

Figure 3:
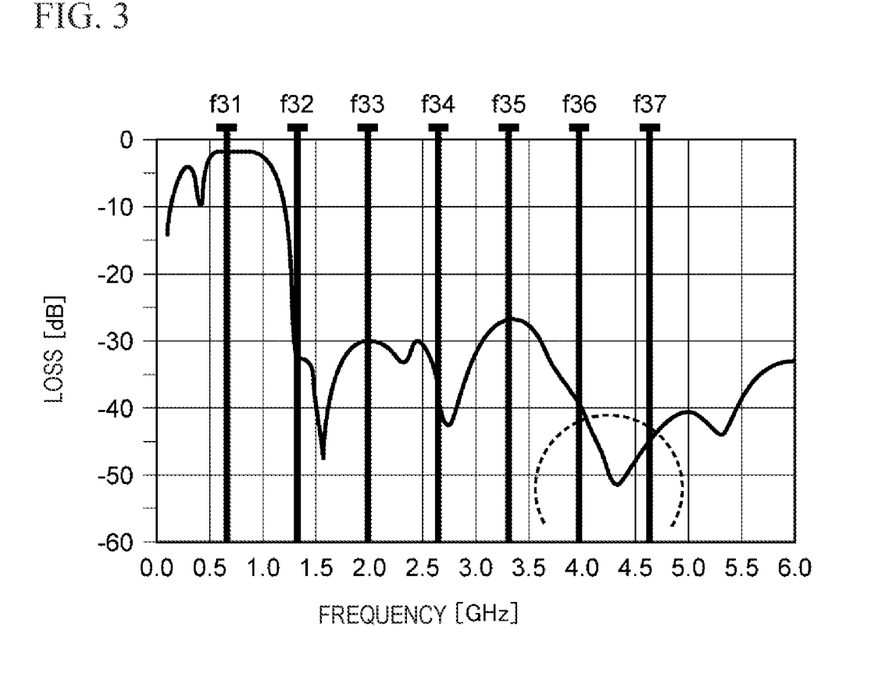
FIG. 3 is a graph illustrating an example of the loss in the power amplifier circuit according to the present embodiment.

Referring to FIG. 3 to FIG. 6, the adjustment of the phase of reflection coefficient of the third harmonic wave performed by the power amplifier circuit 10 is described. FIG. 3 is a graph illustrating the loss of power that occurs in the output signal RFout when the input signal RFin having a predetermined frequency of a 600 MHz band (VLB: Very Low Band) passes through the power amplifier circuit 10.

In FIG. 3, a fundamental frequency f31 and frequencies f32 to f37 of harmonic waves are illustrated. The loss near f32 is the loss caused by the termination of the second harmonic wave by the resonant circuit 104 and the termination of the second harmonic wave by the resonant circuit 205. The loss near f34 is the loss caused by the termination of the fourth harmonic wave by the resonant circuit 205.

In FIG. 3, the loss increases in the part emphasized with a dashed line circle, that is, frequencies between the frequency f36 and the frequency f37. The loss in this part is the loss caused by the resonance of the resonant circuit 103.

Figure 4:
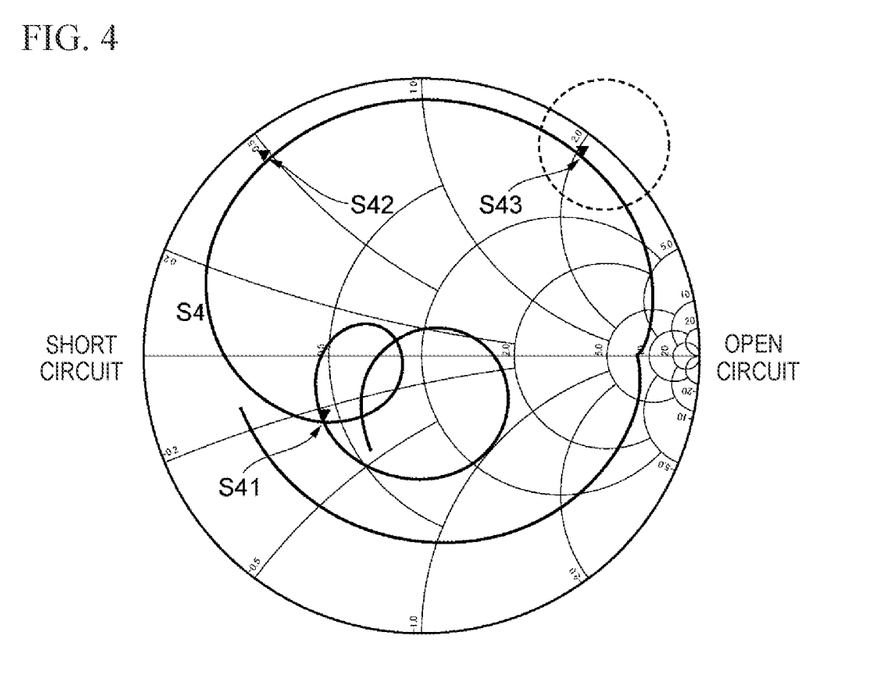
FIG. 4 is a Smith chart illustrating an impedance characteristic of the power amplifier circuit according to the present embodiment.

In FIG. 4, curve S4 illustrating the frequency characteristic of the impedance Z1 in this case is illustrated on the Smith chart. Positions S41, S42, and S43 correspond to the impedances Z1 at the frequencies of the fundamental wave, the second harmonic wave, and the third harmonic wave, respectively.

Now assume that implementation of control of operation of the amplifier 101 by moving the impedance Z1 at the position S43 of FIG. 4 even closer to the open circuit side and making the phase of reflection coefficient of the third harmonic wave closer to 0 degrees.

At this time, in the power amplifier circuit 10, the control is performed so as to increase the capacitance value of the variable capacitance element 1031 of the resonant circuit 103. Because of this, as emphasized by the dashed line circle of FIG. 5, the resonant frequency of the resonant circuit 103 decreases. Note that in FIG. 5, the loss caused by the termination of the second harmonic wave does not change substantially.

Figure 5:
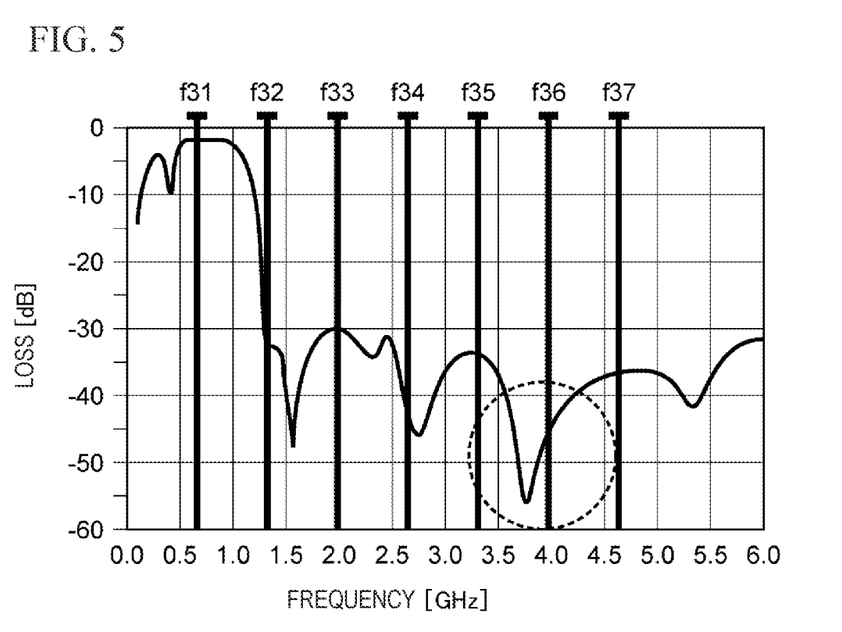
FIG. 5 is a graph illustrating an example of the loss in the power amplifier circuit according to the present embodiment.
Figure 6:
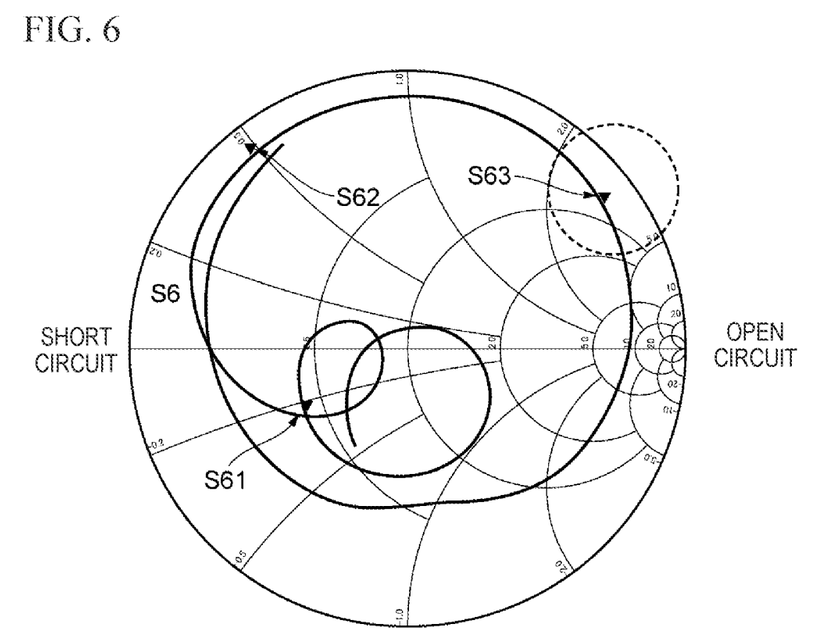
FIG. 6 is a Smith chart illustrating an impedance characteristic of the power amplifier circuit according to the present embodiment.

In FIG. 6, curve S6 illustrating the frequency characteristic of the impedance Z1 in the case of the loss illustrated in FIG. 5 is illustrated on the Smith chart. Positions S61, S62, and S63 correspond to the impedances Z1 at the frequencies of the fundamental wave, the second harmonic wave, and the third harmonic wave, respectively.

When FIG. 4 is compared with FIG. 6, the positions S41 and S42 are not different from the positions S61 and S62, but the position S43 is substantially different from the position S63. That is to say, the position S61 of the impedance Z1 at the frequency of the fundamental wave and the position S62 of the impedance Z1 at the frequency of the second harmonic wave do not change, and the position S63 of the impedance Z1 at the frequency of the third harmonic wave is a position closer to the open circuit side. Accordingly, the power amplifier circuit 10 successfully achieves the adjustment so as to make only the phase of reflection coefficient of the third harmonic wave closer to 0 degrees without necessarily moving the impedances at the frequencies of the fundamental wave and the second harmonic wave. Because of this, it is possible to optimally adjust the output power and the current in the saturation region of the amplifier 101 by adjusting the reflection coefficient of the third harmonic wave while suppressing impacts on the gain and the output characteristic of the amplifier 101, on which the impedance of the fundamental wave has an influence.

Figure 7:
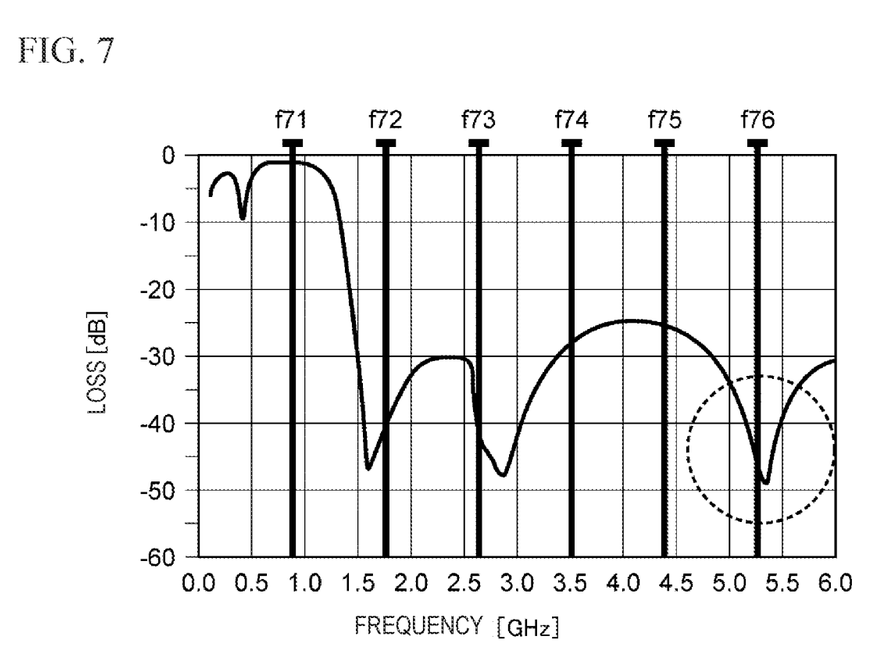
FIG. 7 is a graph illustrating an example of the loss in the power amplifier circuit according to the present embodiment.

Referring to FIG. 7 to FIG. 10, another example of the adjustment of the phase of reflection coefficient of the third harmonic wave, which is to be performed by the power amplifier circuit 10, is described. FIG. 7 is a graph illustrating the loss of power that occurs in the output signal RFout when the input signal RFin having a predetermined frequency of a 800 MHz band (LB: Low Band) passes through the power amplifier circuit 10. The power amplifier circuit 10 is capable of amplifying a VLB signal and any signal of the LB. In the power amplifier circuit 10, the capacitance value of the variable capacitance element 1031, the On/Off states of the switches 1045 and 1046, and the capacitance value of the variable capacitance element 2051 are each controlled in accordance with the frequency of the input signal RFin.

In FIG. 7, a fundamental frequency f71 and frequencies f72 to f76 of harmonic waves are illustrated. The loss near f72 is the loss caused by the termination of the second harmonic wave by the resonant circuit 104 and the termination of the second harmonic wave by the resonant circuit 205. The loss between f73 and f74 is the loss caused by the termination of the third harmonic wave and the fourth harmonic wave by the resonant circuit 205.

In FIG. 7, the loss increases in the part emphasized with a dashed line circle, that is, frequencies near the frequency f76. The loss in this part is the loss caused by the resonance of the resonant circuit 103.

Figure 8:
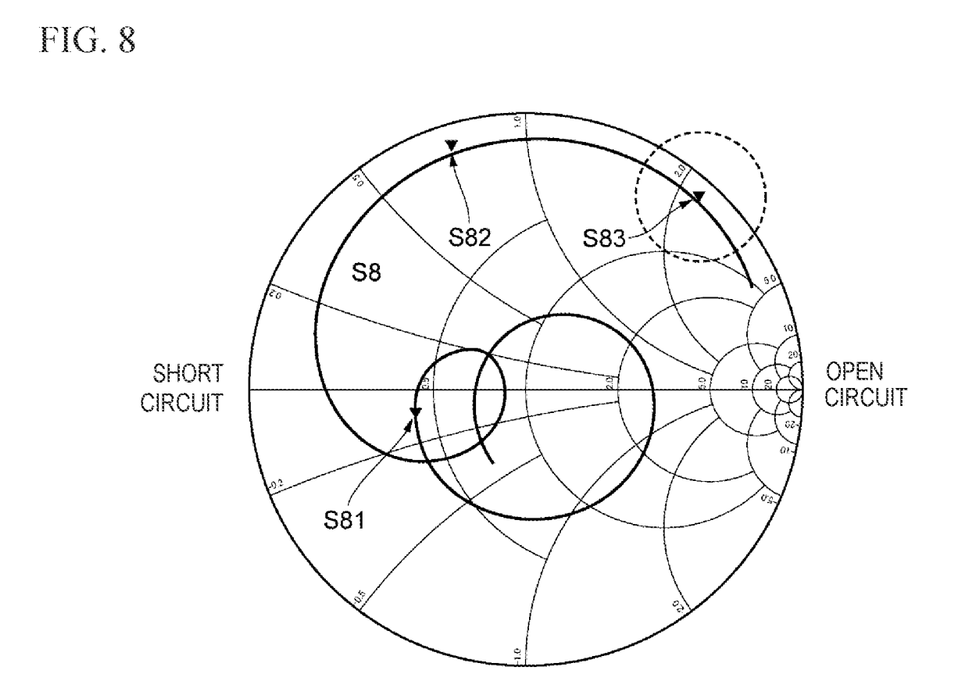
FIG. 8 is a Smith chart illustrating an impedance characteristic of the power amplifier circuit according to the present embodiment.

In FIG. 8, curve S8 illustrating the frequency characteristic of the impedance Z1 in this case is illustrated on the Smith chart. Positions S81, S82, and S83 correspond to the impedances Z1 at the frequencies of the fundamental wave, the second harmonic wave, and the third harmonic wave, respectively.

As is the case with the VLB, also in the LB, assume that implementation of control of operation of the amplifier 101 by moving the impedance Z1 at the position S83 of FIG. 8 even closer to the open circuit side and making the phase of reflection coefficient of the third harmonic wave closer to 0 degrees.

Figure 9:
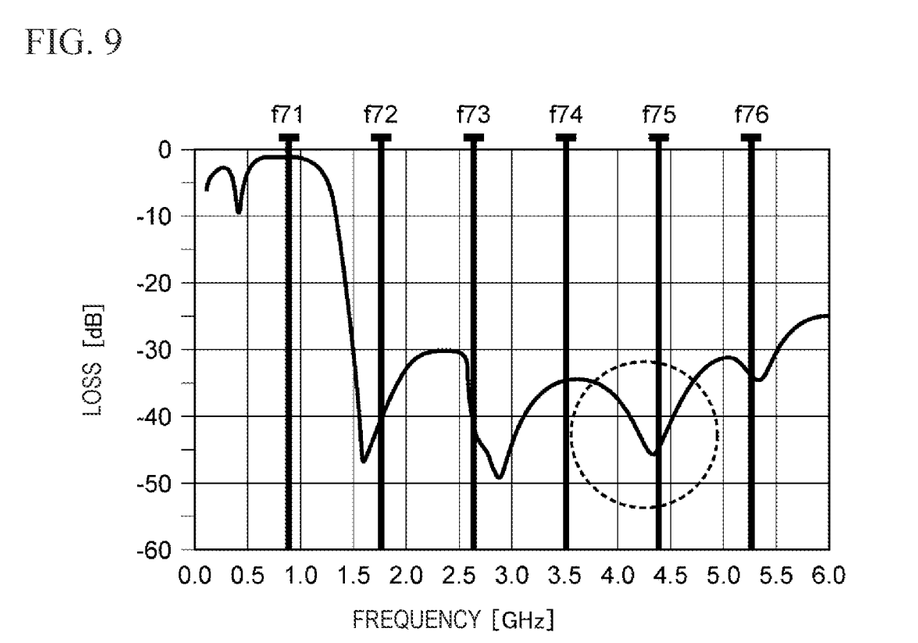
FIG. 9 is a graph illustrating an example of the loss in the power amplifier circuit according to the present embodiment.

In this case, as illustrated in FIG. 9, the capacitance value of the variable capacitance element 1031 is controlled such that the resonant frequency of the resonant circuit 103 approaches the frequency f75.

Figure 10:
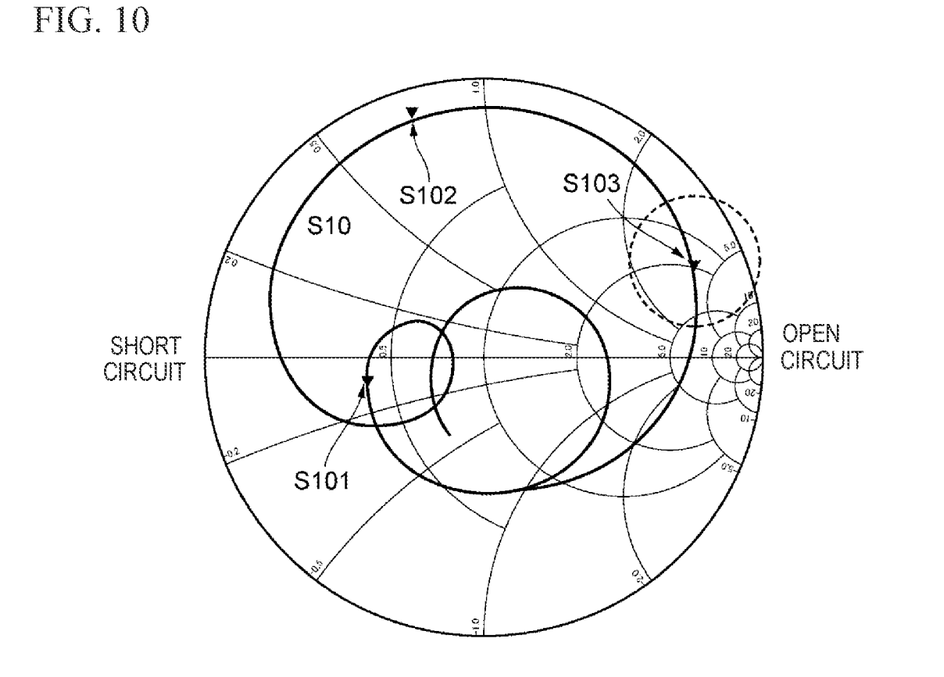
FIG. 10 is a Smith chart illustrating an impedance characteristic of the power amplifier circuit according to the present embodiment.

In FIG. 10, curve S10 illustrating the frequency characteristic of the impedance Z1 in the case of the loss illustrated in FIG. 9 is illustrated on the Smith chart. Positions S101, S102, and S103 correspond to the impedances Z1 at the frequencies of the fundamental wave, the second harmonic wave, and the third harmonic wave, respectively.

When FIG. 8 is compared with FIG. 10, the positions S81 and S82 are not different from the positions S101 and S102, but the position S83 is substantially different from the position S103. The position S103 is a position closer to the open circuit side. Accordingly, also even with the case of the LB, the power amplifier circuit 10 successfully achieves the adjustment so as to make the phase of reflection coefficient of the third harmonic wave closer to 0 degrees.

In the power amplifier circuit 10, as exemplified in the cases with the VLB and the LB, it is possible to perform the adjustment so as to make the phase of reflection coefficient of the third harmonic wave closer to 0 degrees for the input signals RFin having a plurality of frequencies.

An exemplary embodiment of the present disclosure has been described. The power amplifier circuit 10 includes the amplifier 101 that amplifies the input signal RFin, the matching circuit 102 that provides impedance matching between the output port 1012 of the amplifier 101 and the output terminal 1002, an input of the matching circuit 102 being connected to the output port 1012 of the amplifier 101, an output of the matching circuit 102 being connected to the output terminal 1002, and the resonant circuit 103 provided between the ground and the signal path P1 that connects the output port 1012 of the amplifier 101 and the input of the matching circuit 102, the resonant circuit 103 resonating at a resonant frequency greater than or equal to the frequency of the fourth harmonic wave of the amplified signal RF1 obtained by amplifying the input signal RFin.

The resonant circuit 103 resonates at the resonant frequency greater than or equal to the frequency of the fourth harmonic wave, and thus the third harmonic wave is not terminated by the resonant circuit 103. Accordingly, the impedance Z2 for the third harmonic wave does not take a value close to zero. When the impedance Z2 for the third harmonic wave takes a value close to zero, the phase of reflection coefficient of the third harmonic wave takes a value close to 180 degrees. When the third harmonic wave is to be terminated, in the adjustment, an initial value for the phase of reflection coefficient of the third harmonic wave is a value close to 180 degrees. In the power amplifier circuit 10, the resonant circuit 103 enables the impedance Z2 for the third harmonic wave to be set at a value other than the value close to zero. Because of this, it is possible to adjust the initial value in the adjustment of the phase of reflection coefficient of the third harmonic wave, based on the resonant frequency of the resonant circuit 103. This enables the power amplifier circuit 10 to appropriately adjust the phase of reflection coefficient of the third harmonic wave of the amplified signal RF1.

Unlike the power amplifier circuit 10, in the case where a phase adjustment circuit that adjusts the phase of reflection coefficient of a harmonic wave is provided on the output terminal side, the phase adjustment circuit adjusts the phase of reflection coefficient of a harmonic wave that flows a high-impedance signal path. The phase of reflection coefficient of a harmonic wave when looking from the amplifier to the output side is a phase obtained by further changing, by using impedance conversion of the matching circuit, the phase of reflection coefficient having been adjusted by the phase adjustment circuit. Accordingly, in the case where the phase adjustment circuit is provided as a subsequent stage of the matching circuit, the phase adjustment circuit needs to adjust the phase while considering an influence of the matching circuit on the phase. Because of the influence on the phase caused by the impedance conversion of the matching circuit, the impedance looking from the amplifier to the output side is not appropriately adjusted in some cases. On the other hand, the power amplifier circuit 10 enables the phase of reflection coefficient of the third harmonic wave of the amplified signal RF1 to be appropriately adjusted.

Further, in the power amplifier circuit 10, by providing the resonant circuit 103 as a preceding stage of the matching circuit 102, it is possible to adjust the phase of reflection coefficient of the third harmonic wave with the use of smaller elements. Accordingly, the power amplifier circuit 10 is a small power amplifier circuit compared with a power amplifier circuit in which a resonant circuit is provided as a subsequent stage of the matching circuit 102.

Further, in the power amplifier circuit 10, the resonant circuit 103 includes the variable capacitance element 1031 and the inductor 1032, which are connected in series to each other. By adjusting the capacitance value of the variable capacitance element 1031, it is possible to adjust the resonant frequency of the resonant circuit 103 in accordance with the frequency of the input signal RFin. Because of this, even for the input signal RFin whose frequency can be in any one of a plurality of frequency bands, the power amplifier circuit 10 enables the phase of reflection coefficient of the third harmonic wave of the amplified signal RF1 to be appropriately adjusted. Note that in the resonant circuit 103, the inductor 1032 may be replaced by a variable inductor whose inductance value can be adjusted. In this case, as is the case with the variable capacitance element 1031, it is also possible to appropriately adjust the phase of reflection coefficient of the third harmonic wave of the amplified signal RF1, even for the input signal RFin whose frequency can be in any one of a plurality of frequency bands.

Further, the power amplifier circuit 10 further includes the resonant circuit 104 that is provided between the signal path P1 and the ground and resonates at the frequency of the second harmonic wave of the amplified signal RF1. The resonant circuit 105 adjusts the impedance Z1 for the second harmonic wave at the output port 1012. This enables the power amplifier circuit 10 to appropriately adjust the phase of reflection coefficient of the second harmonic wave of the amplified signal RF1. The power amplifier circuit 10 enables the phase of reflection coefficient of the second harmonic wave to be adjusted while adjusting the phase of reflection coefficient of the third harmonic wave such that the amplifier 101 can be operated with an even high degree of efficiency.

Further, in the power amplifier circuit 10, the resonant circuit 104 includes the capacitance element 1041 and the inductors 1042, 1043, and 1044, which are connected in series, and further includes a variable inductor (second inductance element) whose inductance value can be varied. Because of this, even for the input signal RFin whose frequency can be in any one of a plurality of frequency bands, the power amplifier circuit 10 enables the phase of reflection coefficient of the second harmonic wave to be adjusted while adjusting the phase of reflection coefficient of the third harmonic wave. In the resonant circuit 104, the capacitance element 1041 may be replaced by a variable capacitance element (second capacitance element) whose capacitance value can be adjusted.

Note that each of the embodiments described above is provided to facilitate understanding of the present disclosure and is not to be construed as limiting the present disclosure. The present disclosure can be modified or improved without necessarily departing from its spirit, and the present disclosure also includes equivalents thereof. That is to say, ones obtained by suitably modifying designs of the respective embodiments by those skilled in the art are also included within the scope of the present disclosure as long as they include features of the present disclosure. For example, each element included in each embodiment as well as its arrangement, material, condition, size, and the like are not limited to those exemplified, and may be suitably changed. Needless to say, each embodiment is for illustrative purposes only, and constituent elements illustrated in different embodiments may be combined or partially exchanged. Resulting embodiments are also included in the scope of the present disclosure so long as the characteristic features of the present disclosure are included.

What is claimed is:

1. A power amplifier circuit comprising:
    an amplifier configured to amplify an input signal;
    a matching circuit configured to provide impedance matching between an output port of the amplifier and an output terminal of the power amplifier circuit, an input of the matching circuit being connected to the output port, and an output of the matching circuit being connected to the output terminal, the matching circuit comprising an inductor and a third resonant circuit configured to resonate at a frequency of the second harmonic wave, a third harmonic wave, and a fourth harmonic wave of the amplified signal;
    a first resonant circuit connected between ground and a signal path, the signal path connecting the output port and the input of the matching circuit, the first resonant circuit being configured to resonate at a resonant frequency greater than or equal to a frequency of the fourth harmonic wave of an amplified signal obtained by amplifying the input signal, and
    an inductor connected between the output port of the amplifier and the first resonant circuit on the signal path.

2. The power amplifier circuit according to claim 1, wherein the first resonant circuit comprises a capacitance circuit element and an inductance circuit element, the capacitance circuit element and the inductance circuit element being connected in series to one another, and
    wherein a capacitance value of the capacitance circuit element or an inductance value of the inductance circuit element is variable.

3. The power amplifier circuit according to claim 1, further comprising:
    a second resonant circuit connected between the signal path and ground, the second resonant circuit being configured to resonate at a frequency of a second harmonic wave of the amplified signal.

4. The power amplifier circuit according to claim 2, further comprising:
    a second resonant circuit connected between the signal path and ground, the second resonant circuit being configured to resonate at a frequency of a second harmonic wave of the amplified signal.

5. The power amplifier circuit according to claim 3,
wherein the second resonant circuit comprises a second capacitance circuit element and a second inductance circuit element, the second capacitance circuit element and the second inductance circuit element being connected in series to one another, and
wherein a capacitance value of the second capacitance circuit element or an inductance value of the second inductance circuit element is variable.

6. The power amplifier circuit according to claim 4,
wherein the second resonant circuit comprises a second capacitance circuit element and a second inductance circuit element, the second capacitance circuit element and the second inductance circuit element being connected in series to one another, and
wherein a capacitance value of the second capacitance circuit element or an inductance value of the second inductance circuit element is variable.

7. The power amplifier circuit according to claim 3, wherein the first resonant circuit is connected to the signal path between the output port of the amplifier and the second resonant circuit.

8. The power amplifier circuit according to claim 4, wherein the first resonant circuit is connected to the signal path between the output port of the amplifier and the second resonant circuit.

* * * * *